(12) United States Patent
Penelon et al.

(10) Patent No.: US 6,673,197 B2
(45) Date of Patent: *Jan. 6, 2004

(54) CHEMICAL PLASMA CATHODE

(75) Inventors: Joel Penelon, Monrovia, MD (US);
Ivan Berry, Ellicott City, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/336,270

(22) Filed: Jan. 3, 2003

(65) Prior Publication Data

US 2003/0102085 A1 Jun. 5, 2003

Related U.S. Application Data

(63) Continuation of application No. 09/732,064, filed on Dec. 7, 2000, now Pat. No. 6,503,366.

(51) Int. Cl.[7] .................... H05H 1/00; C23C 16/00
(52) U.S. Cl. .................. 156/345.38; 156/345.35; 156/345.41; 156/345.43; 156/345.48; 118/723 MP; 118/723 E; 118/723 MN; 118/723 I

(58) Field of Search .............. 156/345.35, 345.38, 156/345.41, 345.47, 345.48, 345.33; 118/723 MP, 723 E, 723 MN, 723 I; 219/76.16, 121.36, 121.4, 121.43

(56) References Cited

U.S. PATENT DOCUMENTS

| | | | |
|---|---|---|---|
| 5,330,578 A | 7/1994 | Sakama et al. |
| 6,093,903 A | 7/2000 | Schneider |
| 6,368,665 B1 | 4/2002 | Hunt et al. |
| 6,503,366 B2 | 1/2003 | Penelon et al. |

*Primary Examiner*—Parviz Hassanzadek
(74) *Attorney, Agent, or Firm*—Watts Hoffmann Co., L.P.A.

(57) ABSTRACT

A method and apparatus for generating a plasma in a gas using a thermal source and a heat source in a common reaction zone. A process gas is flowed to a reaction zone and heated with a thermal energy source. Within the same reaction zone, a current is passed in the gas to generate a plasma within the gas. The plasma is directed to a substrate for treatment. The substrate may be a silicon wafer as part of an etching, ashing, wafer cleaning, and chemical vapor deposition.

10 Claims, 4 Drawing Sheets

CHEMICAL PLASMA CATHODE

CROSS-REFERENCE TO RELATED APPLICATIONS

This application is a Continuation of, and claims benefit from, U.S. patent application Ser. No. 09/732,064, entitled "Chemical Plasma Cathode," filed on Dec. 7, 2000 now U.S. Pat. No. 6,503,366B2.

FIELD OF THE INVENTION

The present invention is directed to a method and apparatus for generating a plasma in a gas, and more particularly, the invention is directed to a method and apparatus for generating a plasma in a gas at atmospheric pressure using a thermal source and an electrical source.

BACKGROUND ART

During the treatment of silicon wafers used in integrated circuits, a plasma is generated in a gas during several different production steps, including etching, ashing, wafer cleaning, and chemical vapor deposition.

During integrated circuit fabrication, the starting material is typically a silicon substrate covered on one side by a dielectric, or insulating film. A desired circuit pattern for a given layer of the integrated circuit is etched into the dielectric film covering the silicon substrate. To accomplish this, a masking material is disposed on the area of the dielectric film where etching is not desired. In other words, the material masks all areas of the insulting film that will remain, and what is not masked, defines the circuit pattern. Photoresist is the most common masking material. The photoresist must have good adherence to the dielectric film, good coating integrity, and the ability to substantially resist attack from the etchant. First, an etching gas is selected so as to generate active species which are chemically reactive with the dielectric material, but substantially less chemically reactive with the photoresist. The etching gas is generated in a plasma, a highly ionized gas composed of an approximately equal number of positive and negative charges, as well as other non-ion particles. The plasma is typically generated by electric current, radio frequency or microwave energy. The plasma is then supplied to the surface of the dielectric being etched, causing the reactive species of the etching gas plasma to diffuse into the surface of the dielectric film. The etching gas reactive species chemically react with the dielectric film to form a volatile by-product. The volatile by-product is then desorbed from the surface of the dielectric film and diffuses into the bulk of the etching gas.

After the pattern is etched into the dielectric layer, the photoresist that was used to define the metal circuit pattern on the dielectric layer is removed. Also, any post-etch residues including side wall polymer deposition also must be thoroughly removed or stripped from the underlying dielectric layer. There are two generally recognized stripping processes for removing photoresist and post etch residues remaining on the surface after the dielectric etch is complete. The residual photoresist and post etch residues can be removed by using either a wet or a dry chemistry process. Wet chemistry involves removing photoresist and post etch residues by dissolution in a suitable acid or solvent. However, the prohibitive cost of wet chemistry, environmental concerns associated with its use and disposal, and product contamination issues have led most manufacturers to use a dry process.

One dry chemistry process used to strip photoresist and photoresist residues from the dielectric layer is commonly referred to as ashing. The process of ashing is similar to the etching process. Ashing is a technique by which the residual photoresist and post etch residues are exposed to a plasma. Typically, the plasma is generated from a gas mixture containing oxygen gas as one of its components. The highly reactive oxygen plasma reacts with or oxidizes the organic photoresist layer. The oxidation or combustion products resulting from the ashing operation are volatile components such as carbon dioxide and water vapor, and are carried away in a gas stream. Ashing is preferred to wet chemical removal because fewer process steps are involved, less handling of the substrates is required, the number of chemicals used is smaller and required chemical handling equipment are less complex, and ashing is more environmentally acceptable. Finally, after the ashing process is complete, the etched pattern within the dielectric film layer is filled with copper or other conductive material. The entire process can then be repeated to form multi-layer integrated circuits.

In integrated circuit production, thin films are utilized for a host of different applications. One advantageous method of depositing thin films is Chemical Vapor Deposition, or CVD. CVD is defined as the formation of a non-volatile solid film on a substrate by the reaction of vapor phase chemicals. CVD is often preferred over other deposition methods because it can achieve high purity deposits, a great variety of chemical compositions can be deposited, and good economy and process control is obtainable. A basic CVD process starts with reactant gases and diluent inert gases introduced into a reaction chamber. The gas species move to the substrate and the reactants are adsorbed on the substrate surface. Next, the reactants undergo migration and film-forming chemical reactions. Finally, the gaseous by-products are desorbed into the gas stream and removed from the reaction chamber. The energy to drive a typical CVD reaction is most commonly thermal. Plasma Enhanced Chemical Vapor Deposition, or PECVD, uses not only thermal energy, but also an rf-induced glow discharge to transfer energy into the reactant gases.

Several basic plasma generating methods are common in the prior art. U.S. Pat. No. 5,330,578 to Sakama et al. discloses a plasma gaseous reaction apparatus including a reaction chamber, a system for supplying reaction gas to the reaction chamber, and a pair of facing electrodes disposed in the reaction chamber. The reaction chamber also includes a pressure control system for adjusting pressure to a predetermined value, and a vacuum pump for exhausting the chamber. The plasma is generated by supplying high frequency power to the electrodes from a power source. A high frequency signal source (13.56 MHz) is used for the power source. When the power is supplied, a plasma is generated between the electrodes. A plurality of substrates are simultaneously treated within the reaction chamber.

Plasma generating methods at atmospheric pressure using metal electrodes as cathodes are also known in the prior art. These methods often required a high frequency signal with a voltage as high as 20 kV to maintain a plasma generated between two electrodes. However, in these techniques, the metal on the electrodes tends to breaks down over time and cause wafer contamination. The present invention seeks to use a flame to initiate and sustain a DC, RF or microwave plasma to avoid electrode breakdown and wafer contamination. Further, the voltage required to maintain the plasma may be lower than 1 kV, significantly reducing energy costs.

A need exists for a lower cost, flexible plasma generation technique with applications to etching, ashing, wafer cleaning and chemical vapor deposition processes. The present invention advantageously allows for a highly flexible plasma generation, with high chemical species disassociation and lower energy costs, while minimizing wafer-contamination from electrode breakdown.

SUMMARY OF THE INVENTION

The present invention addresses the need to generate a plasma in a process gas at atmospheric pressure using an inexpensive, flexible method and apparatus with applications to etching, ashing, wafer cleaning and chemical vapor deposition processes.

The method practiced in accordance with an exemplary embodiment of the invention, flows a process gas into a reaction zone, heats the process gas within the reaction zone with a heat source, passes an electric current through the process gas in the reaction zone to generate a plasma within the process gas, and further positions a substrate in the path of the reaction zone output for treatment with the plasma. The invention provides efficient generation of a plasma, with higher proportions of disassociated molecules within the gas and requires lower voltages to maintain the plasma. This results in decreased energy costs, while minimizing wafer-contamination from electrode breakdown.

The method may use a burner as a heat source, and charged electrodes, a microwave cavity, or RF coils to generate the current within the plasma. Practice of the invention allows creation of a reaction zone at atmospheric pressure for treating a silicon wafer. The wafer treatment process may be part of commercial production etching, ashing, wafer cleaning, or chemical vapor disposition process.

These and other objects, advantages and features of the invention will become better understood by review of the accompanying detailed description of a preferred embodiment of the invention which is described in conjunction with the accompany drawings.

BEST MODE FOR CARRYING OUT THE INVENTION

The disclosed exemplary embodiment of the present invention addresses the need to generate a plasma in a process gas at atmospheric pressure using an inexpensive, flexible method and apparatus with applications to etching, ashing, wafer cleaning and chemical vapor deposition processes.

Figure 1:
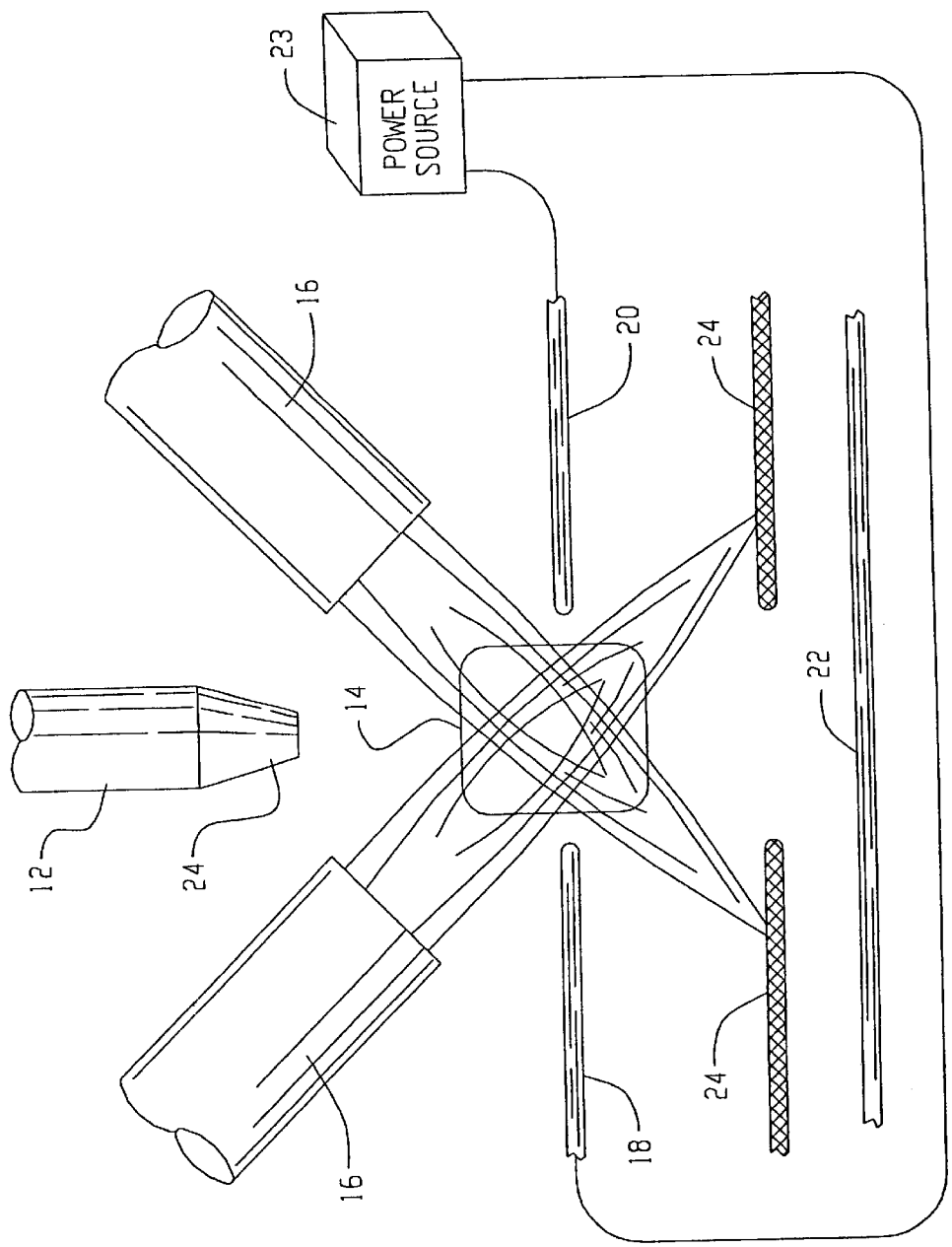
FIG. 1 is a side elevation view of a plasma generation apparatus having a gas nozzle, burners, and electrodes.

As shown in FIG. 1, the system 10, constructed in accordance with an exemplary embodiment of the invention, generates a plasma in a process gas and treats a substrate, and according to the method of the present invention includes, a process gas source 12 for flowing a gas into a reaction zone 14, a heat source 16 for heating the process gas within the reaction zone 14, and a pair of electrodes 18, 20 for passing a current in the process gas within the reaction zone 14. A substrate 22 is treated by the generated plasma. The system 10 as shown in FIG. 1 operates at atmospheric pressure, although it should be understood by those skilled in the art that specific environment pressure controls could be utilized as well. The substrate may be a silicon wafer undergoing treatment as part of a commercial etching, ashing, wafer cleaning and chemical vapor deposition process.

The process gas is flowed to the reaction zone 14 from a supply that may include a bulk source (not shown), a process gas source 12, and terminates in a gas nozzle 24, known in the art. The process gas source 12 includes controls (not shown) for adjusting the gas flow rate. Substrate treatment methods for silicon wafers require process gas flow rates from about 1 to 2 liters/minute, but as understood by those skilled in the art, other flow rates may be used as well. Specific process gases are selected for use dependent on the treatment process desired. Etching processes can be performed with the present invention using process gases containing $CF_4$, $NF_3$, and chlorine. Ashing processes can be performed with the present invention using process gases containing oxygen, nitrogen, and hydrogen. Chemical vapor deposition processes can be performed with the present invention using process gases containing $CH_4$ and $SiF_4$. Wafer cleaning processes can be performed with the present invention using process gases containing fluorine or chlorine. It should be clear to those skilled in the art that other suitable process gases can be used as well.

A thermal heat source includes at least one burner 16 (two burners are depicted in FIG. 1) which heats the process gas within the reaction zone 14. As shown in FIG. 1, the burner may be physically positioned so that the output of the process gas nozzle 24 reacts with the flame output within the reaction zone 14. Once a current is passed through the process gas by the electrodes 18, 20, a plasma is generated in the process gas. The flame performs two functions. First, the flame advantageously acts to increases the disassociation of the process gas. Second, this increased disassociation permits the plasma to be sustained at a lower voltage, thereby decreasing energy costs and reducing electrode erosion. The burners 16 contain controls (not shown) for adjusting the burner flame geometry and magnitude. Heating the process gas can be performed with the present invention using a flammable gas (e.g. hydrogen) with an oxygen based mixture (e.g. nitrogen). It should be clear to those skilled in the art that other suitable flammable gases can be used as well The electrodes 18, 20 are opposingly disposed in a manner bounding the reaction zone 14 as shown in FIG. 1. The electrodes may be constructed from a electrically conductive metal, such as tungsten. A DC voltage power supply (not shown) can be utilized to oppositely charge the electrodes 18, 20. Once a current arcs between the electrodes, a conductive plasma has been generated within the gas. The voltage required to maintain a current, and therefore maintain a conductive plasma, is a function of the distance the electrodes are apart and the flame temperature. Typically, with the electrode tips placed 1" apart, and at atmospheric pressure, about 1 kV or less is required to maintain the current. In the prior art, without the use of a flame in the reaction zone, as much as 20 kV is required to maintain the current at atmospheric pressure. A power supply 23 shown in FIG. 1 contain controls (not shown) for adjusting the voltage between the electrodes 18, 20.

The substrate 22 treated in the preferred embodiment of the invention may be a silicon wafer used in fabricating integrated circuits. The wafer is typically disk-shaped. The substrate may be protected from excessive thermal exposure by a screen 24, as shown in FIG. 1. The screen 24 permits the plasma to treat the substrate in desired locations, but deflects heat from untreated areas.

Figure 2:
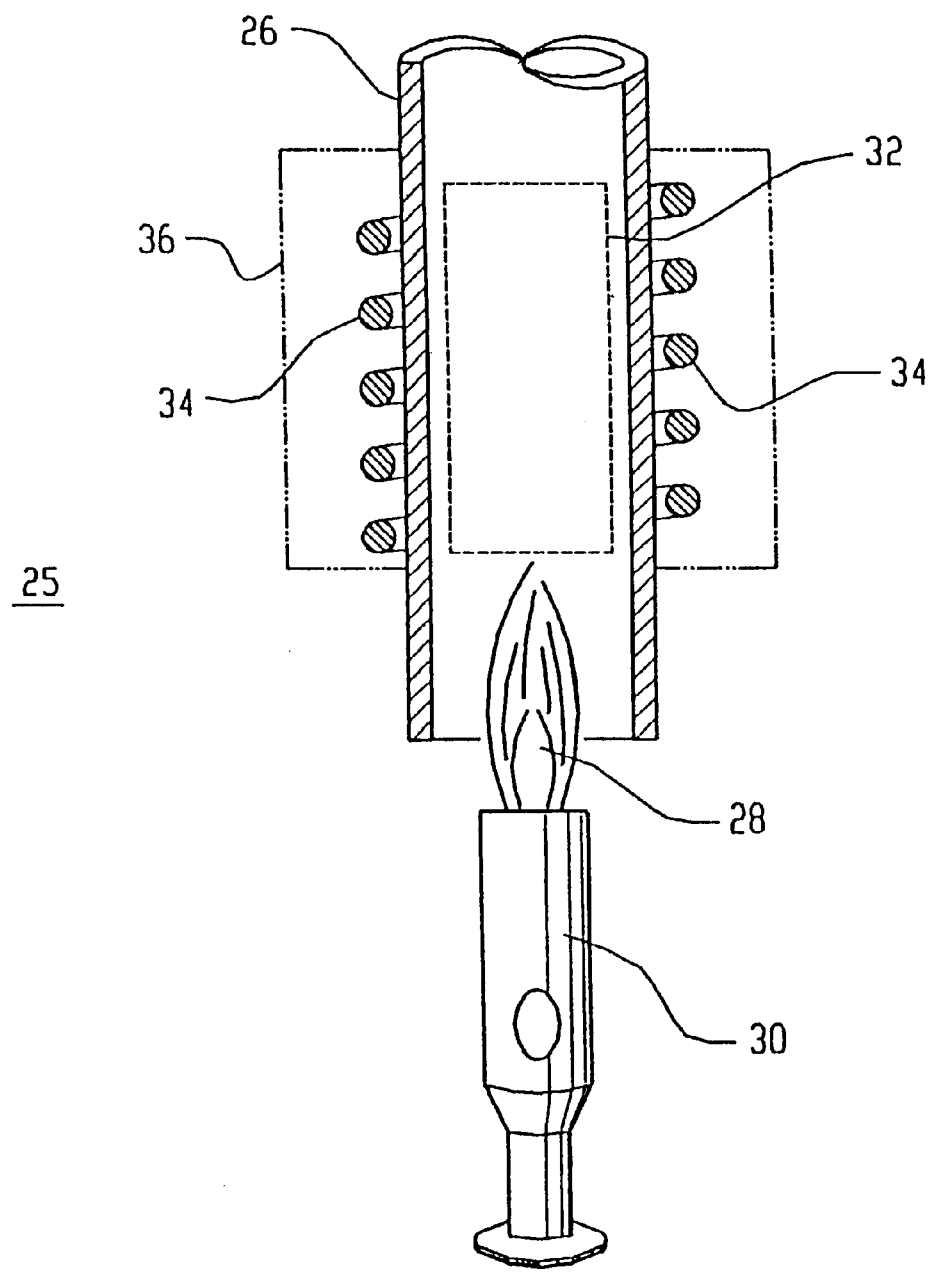
FIG. 2 is a partial sectional view of a second embodiment of the invention.

In another embodiment of the present invention (FIG. 2), a plasma is generated in a process gas within a pipe 26 using RF or microwave energy. Applicants have found a pipe constructed of quartz or sapphire with a 1" inner diameter and 12" in length to be advantageous, but pipes of other materials and sizes may be used as well. As shown in FIG. 2, a flame 28 is generated by a burner 30 at the entrance to the pipe and is controlled to direct heat within the pipe to a reaction zone 32. Process gas is flowed into the pipe 26 by a process gas source (not shown), and enters the tube immediately below the flame. The process gas is controlled to flow into the reaction zone 32. As shown in FIG. 2, a section of the pipe which bounds the reaction zone 12 is surrounded by RF coils 34. The coils 34 surround the exterior portion of the pipe that bounds the internal reaction zone 32. The RF coils are energized and produce a plasma within the reaction zone 32 without a discharge or arc of current. Alternatively, rather than coils being used, the exterior portion of the pipe that bounds the internal reaction zone 32 may be placed in a microwave cavity 36. Regardless of the source of the energy, a plasma is generated in the gas within the pipe and is directed out of the pipe toward a substrate (not shown). The plasma directly expands and exits the pipe 26, pushed up by the continual process gas flow. Further, the addition of an inert gas, such as helium or argon, to the process gas within the pipe, can facilitate the breakdown of the process gas and help to stabilize the chemical properties of the plasma.

Figure 3:
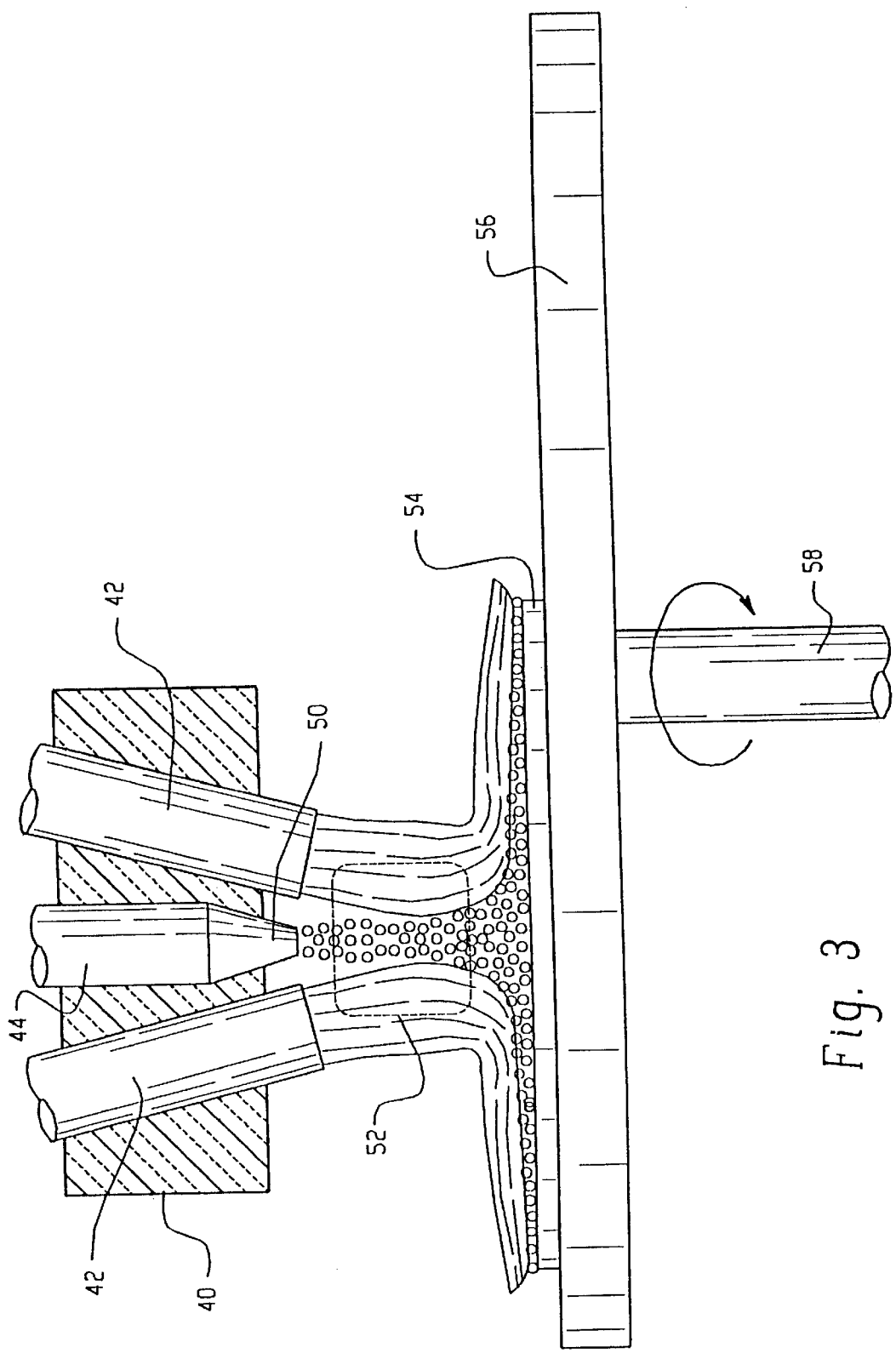
FIG. 3 is a side elevation view of a plasma generation apparatus having a gas nozzle, burners, and a voltage source.

FIG. 3 shows another embodiment of the present invention. FIG. 3 is a side elevation view of a plasma generation apparatus. An insulated connection assembly 40 houses two burners 42, a process gas source 44, and an electrical current power supply (not shown), connected between the electrodes (not shown). In this embodiment, the position of the insulated connection assembly 40 is fixed. The process gas source 44 contains a gas nozzle 50 which directs the process gas toward a reaction zone 52. Within the boundaries of the reaction zone 52, an electrical discharge and flames extending from the gas burners 42 interact with the process gas and lead to plasma formation within the process gas. In this embodiment, the substrate 54 is a silicon wafer, disposed upon a temperature controlled rotating chuck 56. The chuck includes temperature controls (not shown) which act to moderate the temperature of the silicon wafer and prohibit excessive thermal exposure. As shown in FIG. 3, the reaction zone 52 at the confluence of the burners 42 and gas source 44 is not at the center point of the chuck 56. A rotational shaft 58 rotates the silicon wafer 54 to ensure the entire wafer surface is treated by the plasma.

Figure 4:
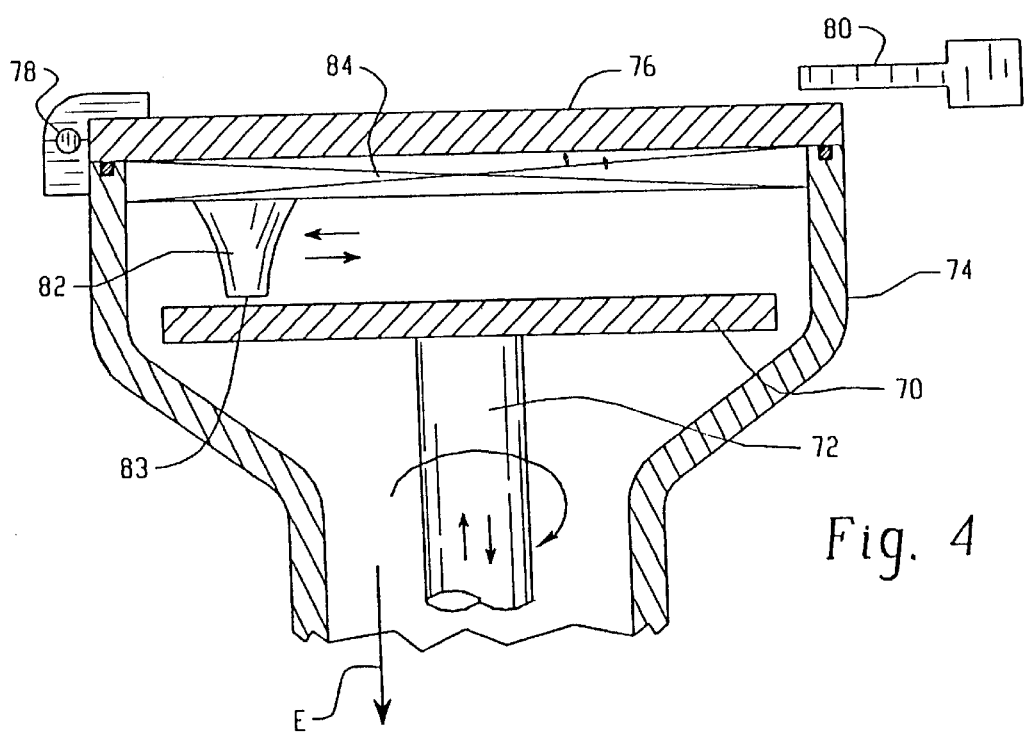
FIG. 4 is side elevation view (partially in section) of a wafer treatment production apparatus.

FIG. 4 is side elevation view, partially in section, of a wafer treatment production apparatus constructed according to the present invention. As shown in FIG. 4, a chuck 70 is attached to a rotating shaft 72 within an environmental vessel 74. Wafers for treatment are placed on the chuck peripherally in a equally spaced pattern by a robot arm 80. The vessel may operate at atmospheric pressure, or at a controlled pressure, depending on the wafer treatment process desired. The vessel comprises a main body 74, a lid 76, and a hinge 78. When the hinge 78 is opened by manual or automatic means, the top surface of the chuck 70 is exposed. The rotational shaft 72 comprises means for translation vertically. When the lid 76 is open, the chuck may be raised to allow wafer pieces for treatment to be placed on the chuck in a circular, equally spaced pattern by a robot arm 80. The process may be repeated to remove wafers after treatment. During wafer treatment, a plasma is generated in a reaction zone within a funnel assembly 82, comprising a process gas source, a thermal energy source, and a voltage source (all not shown). The plasma is outputted from a discharge end 83 of the funnel assembly 82 for wafer treatment. The funnel assembly 82 translated horizontally via a translating mechanism 84, facilitating treatment of the entire wafer surface. The translation range of the funnel assembly 82 may be from the circumference of the chuck to its center point. The rotating shaft 72 operates to transport the next sequential wafer into a position treatable by the funnel assembly 82. Each wafer on the chuck or support 70 is fully treated and then rotated to allow a next sequential wafer to be treated.

Figure 5:
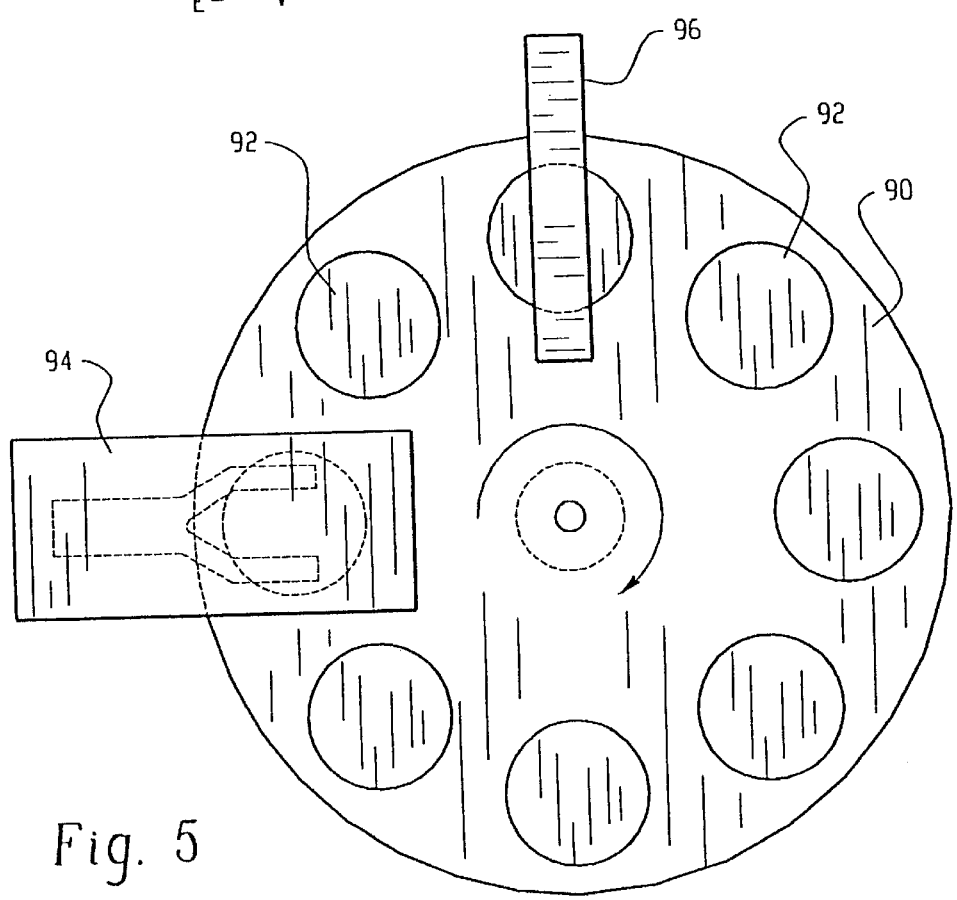
FIG. 5 is top plan view of a second wafer treatment production apparatus.

FIG. 5 is top plan view of a second wafer treatment production apparatus constructed according to the present invention. As viewed from the top, a rotatable chuck 90 forms a surface area onto which wafers 92 are placed in a circular, equally spaced pattern. The wafers 90 are placed on the chuck prior to treatment, and removed after treatment, by pick-and-place apparatus 94, available in the prior art. The chuck as viewed in FIG. 5 rotates in a clockwise direction. A stationary line plasma torch 96 comprises a process gas source, a thermal energy source, and a voltage source (all not shown). A plasma is generated in a reaction zone within the stationary line plasma torch 96 and is outputted for wafer treatment.

Although the present invention has been described with a degree of particularity, it is the intent that the invention include all modifications and alterations falling within the spirit or scope of the appended claims.

We claim:

1. An apparatus for generating a plasma in a gas for use during silicon wafer production, said apparatus comprising:
    a) a gas source for supplying a process gas to a reaction zone;
    b) at least one process gas nozzle in communication with the gas source;
    c) at least one burner, for igniting the process gas and providing thermal energy to the reaction zone;
    d) a pair of opposingly disposed electrodes for generating and passing a current in the process gas within the reaction zone; and
    e) a power source connected to the electrodes.

2. The apparatus of claim 1 wherein said power source contains a plurality of controls for adjusting a voltage between said electrodes.

3. The apparatus of claim 1 wherein said burner contains a plurality of controls for adjusting a geometry and a magnitude of a flame generated by the ignition of the gas.

4. The apparatus of claim 1 further comprising a heat shield disposed above a substrate, wherein said heat shield controls thermal exposure to the substrate.

5. An apparatus for generating a plasma in a gas for use during silicon wafer the apparatus comprising:

a) a gas source for supplying a process gas to a reaction zone;
b) at least one process gas pipe in communication with the gas source for supplying the process gas to the reaction zone;
c) at least one burner for igniting the process gas and providing a thermal energy source to the reaction zone; and
d) a second energy source for generating the plasma in the process gas within the reaction zone.

6. The apparatus of claim 5 wherein said process gas pipe is formed from a material selected from the group consisting of quartz and sapphire.

7. The apparatus of claim 6 wherein said process gas pipe comprises about a 1 inch diameter and about 12 inches in length.

8. The apparatus of claim 5 wherein said burner ignites the gas to produce a flame wherein the flame is directed at an inlet of the pipe.

9. The apparatus of claim 5 wherein said second energy source comprises a microwave cavity.

10. The apparatus of claim 5 wherein said second energy source comprises at least one RF coil.

* * * * *